United States Patent [19]
Wang et al.

[11] Patent Number: 5,759,892
[45] Date of Patent: Jun. 2, 1998

[54] FORMATION OF SELF-ALIGNED CAPACITOR CONTACT MODULE IN STACKED CYCLINDRICAL DRAM CELL

[75] Inventors: Chen-Jong Wang; Mong-Song Liang, both of Hsin-Chu, Taiwan

[73] Assignee: Taiwan Semiconductor Manufacturing Company Ltd., Hsin-Chu, Taiwan

[21] Appl. No.: 719,237

[22] Filed: Sep. 24, 1996

[51] Int. Cl.⁶ .................. H01L 21/8242; H01L 21/20
[52] U.S. Cl. ........................................ 438/254; 438/397
[58] Field of Search .................................. 438/238, 239, 438/253–255, 381, 396–398; 257/306, 307, 309

[56] References Cited

U.S. PATENT DOCUMENTS

| | | | |
|---|---|---|---|
| 5,217,914 | 6/1993 | Matsumoto et al. | 438/253 |
| 5,332,685 | 7/1994 | Park et al. | 437/52 |
| 5,451,539 | 9/1995 | Ryou | 437/60 |
| 5,459,094 | 10/1995 | Jun | 438/254 |
| 5,501,998 | 3/1996 | Chen | 437/52 |

*Primary Examiner*—Joni Chang
*Attorney, Agent, or Firm*—George O. Saile; Stephen B. Ackerman; William J. Stoffel

[57] ABSTRACT

The present invention provides a method of manufacturing a cylindrical capacitor which has plug spacers that reduce capacitor size and increase overlay tolerances. The method begins by forming an insulating layer and a passivation layer over a substrate. A plug opening is formed through the passivation layer and the insulating layer. A polysilicon plug is formed in the plug opening. Plug opening spacers are formed on the sidewalls of the insulating and passivation layers in the plug opening. A first dielectric layer having a bottom electrode opening is formed over passivation layer and the plug is exposed. A third polysilicon layer is formed over the first dielectric layer and on the sidewalls of the first dielectric layer. A second dielectric layer is formed over the third polysilicon layer and in the bottom electrode opening. The second dielectric layer and the third polysilicon layer are RIE etched down to the level on the top surface of the first dielectric layer. The third polysilicon layer in the electrode opening forms a capacitor bottom electrode over the plug. The first dielectric layer and the second dielectric layer are etched away. The plug spacer and the plug prevent the etch from etching voids in the underlying insulating layer when the bottom electrode is misaligned relative to the plug.

29 Claims, 6 Drawing Sheets

FORMATION OF SELF-ALIGNED CAPACITOR CONTACT MODULE IN STACKED CYCLINDRICAL DRAM CELL

BACKGROUND OF THE INVENTION

1. Field of the Invention

This invention relates generally to the fabrication of cylindrical capacitors for semiconductor devices and more particularly to the formation of cylindrical capacitors and contacts for semiconductor memory devices.

2. Description of the Prior Art

There is a continuous challenge to reduce the size and increase the performance of semiconductor devices. This miniaturization creates problems in photolithography alignment and in forming contacts to the substrate. Moreover, the decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of memory cell as well as consumes excessive power during low-voltage operation by impeding device operation. Generally, in a 64 MB DRAM having a 1.5 µm$^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example double-stacked, fin-structured, cylindrical, spread-stacked, and box structured capacitors. Since both outer and inner surfaces can be utilized as an effective capacitor area, the cylindrical structure is favorably suitable to the three-dimensional stacked capacitor, and is more particularly suitable for an integrated memory cell which is 64 Mb or higher. A major challenge with these stacked capacitors is forming contact to the substrate.

Generally in the manufacturing of a DRAM cell of a highly integrated semiconductor device, making a storage electrode contact with a silicon substrate is a difficult process because of the alignment of the various photolithography masks. For example, the alignment of the base of the bottom electrode (i.e., the plug) to the overlaying cylindrical electrode is critical. The alignment tolerances should be increased to reduce misalignment errors and yield losses.

When these microminiature capacitors are further reduced in size, it also becomes more difficult to improve the masking level tolerance and etch tolerance required for manufacturing good memory chips. To avoid these problems, others have proposed methods for self aligning the storage node contact of the capacitor to the device contact on the substrate. But they still require masking and etching to form the capacitor electrode structure.

A short coming with current methods of forming cylindrical capacitors is that it is difficult to align the bottom and top parts of the bottom electrode. Tight photolithography tolerances are required to ensure that parts of the electrode are aligned properly and make electrical contact. Also if electrode parts are not properly aligned, voids in underlying insulating layers can be formed by subsequent etches. Moreover, photo overlay tolerances can be increased, but this reduces the cell size and thus the capacitance and DRAM performance.

The following US patents show related processes and capacitor structures: U.S. Pat. No. 5,332,628 (Park), U.S. Pat. No. 5,501,998 (Chen) and U.S. Pat. No. 5,451,539 (Ryou). These patents show approaches that use a structural solution to increase the storage node area and capacitance. However, these approaches can be improved by increasing the photo overlay tolerances between the plug to the electrode and to further reduce the capacitor size. Also, many of these prior art methods also require substantially more processing steps or/and planar structures which make the manufacturing process more complex and costly. In addition, other process methods rely on etching to a predetermined etch depth which can be quite difficult to control in a manufacturing environment. For example, during plasma etching outgassing, virtual or real leaks, back streaming from pumps and loading effects, to name a few, can change the chemistry of the etching environment in the process chamber, making a calibrated etch time approach difficult to control. Therefore, it is very desirable to develop processes that are as simple as possible and also provide methods for increasing the photolithography alignment tolerances and increase yields.

There is a challenge to develop methods of manufacturing these capacitors that minimize the manufacturing costs and maximize the device yields. In particular, there is a challenge to develop a method which minimizes the number of photoresist masking operations, reduces capacitor size, and provides maximum photo alignment tolerances to maximize product yields.

SUMMARY OF THE INVENTION

It is an object of the present invention to provide a method for fabricating a capacitor which provides a larger photolithography process window and improves yields.

It is an object of the present invention to provide a method for fabricating a cylindrical capacitor having a void free insulting layer and a stringer free bottom polysilicon electrode.

It is an object of the present invention to provide a method for fabricating a DRAM having capacitor having larger process photo overlay tolerances from the bottom polysilicon plug to the bottom polysilicon cylindrical electrode and which is low cost and simple to manufacture.

It is an object of the present invention to provide a method for fabricating a DRAM having capacitor having plug sidewall spacers that eliminate voids in the surrounding dielectric layer and increases photo overlay tolerances from the bottom polysilicon plug to the bottom polysilicon cylindrical electrode.

To accomplish the above objectives, the present invention provides a method of manufacturing a capacitor having polysilicon plug opening sidewall spacers. These spacers increase the alignment tolerances and prevent voids from being etched in the insulating layer in the event of electrode misalignment. The method begins by providing a semiconductor substrate having a device region formed therein. An insulating layer 14 preferably composed of silicon oxide is deposited over a substrate 10 surface. A passivation layer 20 preferably composed of silicon nitride is formed over the insulating layer 14. A plug contact opening 24 is formed through the passivation layer 20 and the insulating layer 14 exposing the device region 16.

A first polysilicon layer 30 is deposited over the passivation layer 20 and in the contact openings 24 to form a bottom capacitor plug 32 and make an electrical contact to the device region 16. The first polysilicon layer 30 is anisotropically etched so that the top surface of the first polysilicon layer 32 is below the level of the top surface of the passivation layer 20 to form a plug 32.

In an important step, a second polysilicon layer 34 is formed over the passivation layer 20 and the plug 32. Next, the second polysilicon layer 34 anisotropically etched forming polysilicon plug opening sidewall spacers 35 (i.e., spacers) on the sidewalls of the passivation layer 20 and the insulation layer 14.

A first dielectric layer 40 is then formed over the passivation layer, the plug sidewall spacers and the plug. A bottom electrode opening 48 is formed in the first dielectric layer 40. The bottom electrode opening 48 at least partially exposes the plug contact opening 24 and the plug 32. A third polysilicon layer 44 is formed over the first dielectric layer 40 and on the sidewalls 48 of the first dielectric layer and contacts the polysilicon spacers 35 and the bottom electrode plug. A second dielectric layer 46 is formed over the third polysilicon layer 44 and in the bottom electrode opening 48. The second dielectric layer 46 and, the third polysilicon layer 44 are planarized down to the level on the top surface of the first dielectric layer 40. The third polysilicon layer forms a capacitor bottom electrode 50 over the bottom electrode plug. The first dielectric layer 40 and the second dielectric layer 46A are removed, preferably in a wet etch. A capacitor dielectric layer 54 and a third polysilicon layer 60 are sequentially formed over the capacitor bottom electrode 50 thereby forming capacitor.

The invention provides a method of forming a capacitor that provides larger overlay tolerance from the bottom poly plug to the top cylindrical electrode. A key feature of the invention is the plug opening spacers 35 formed on the sidewalls of the insulating layer 14 and the plug 32 in first plug opening 29. These plug spacers and the plug form an etch barrier which protects the insulation layer 14 from the subsequent etch of the dielectric layer 40. The plug opening sidewall spacers and the polysilicon plug prevent voids from forming in the insulating layer during the wet etching of the second dielectric layer 46 and the first dielectric layer 40 due to misalignment of the bottom electrode opening 49. The overlay tolerance requirements can be eliminated because the plug spacers protect the insulation layer 14 from etching when the cylindrical electrode 50 is misaligned to the plug 32. The spacers increase the alignment tolerances from about 0.2 to 0.0 μm. The reduction in overlay tolerance shrinks the size of the cell area by between about 1 and 2% and thus reducing chip size while maintaining capacitance.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 9 is cross-sectional view of a capacitor showing how the plug sidewall spacers and the plug 32 prevent voids from forming when the top electrode 50 is mis-aligned.

DETAILED DESCRIPTION OF THE PREFERRED EMBODIMENTS

The present invention will be described in detail with reference to the accompanying drawings. The present invention provides a method of forming a cylindrical capacitor which has larger photolithography overlay tolerances and is simple to manufactures. The invention also provides for a dynamic random access memory (DRAM) having the cylindrical capacitor.

It should be well understood by one skilled in the art that by including additional process steps not described in this embodiment, other types of devices can also be included on the chip. For example, P wells in the P substrate and CMOS circuit can be formed therefrom. It should also be understood that the figures depict only one DRAM storage cell out of a multitude of cells that are fabricated simultaneously on the substrate. Also, the capacitor can be used in other chip types in addition to DRAM chips.

Figure 1:
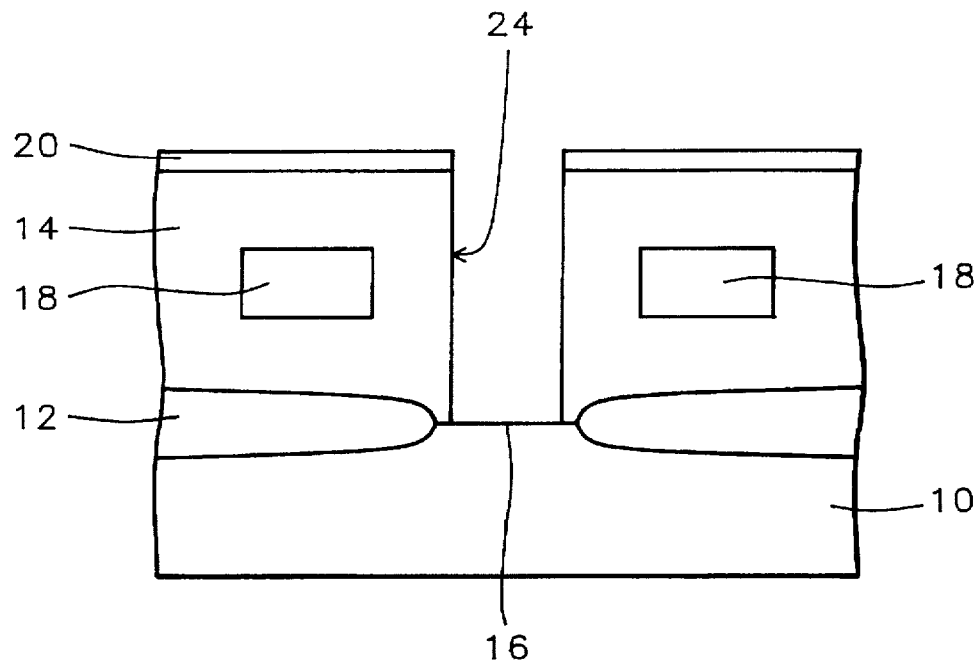
FIGS. 1 through 9 are cross sectional views for illustrating a method for manufacturing the cylindrical capacitor according to the present invention.
Figure 10:
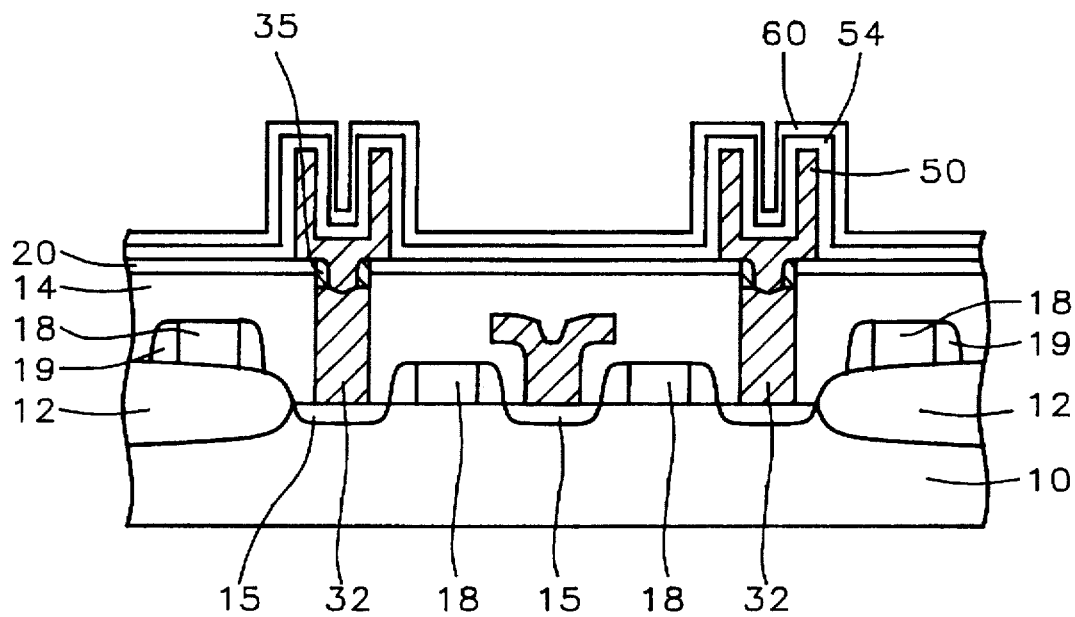
FIG. 10 is a cross sectional view of illustrating a method of manufacturing the dynamic random access memory (DRAM) having a cylindrical capacitor and contact of the present invention.

As shown in FIG. 1, the method begins by providing a semiconductor substrate 10 having a device region 16 formed therein. Substrate 10 is understood to include a semiconductor wafer, and active and passive devices formed within the wafer and layers formed on the wafer surface. The term "substrate" is mean to include devices formed within a semiconductor wafer and the layers/devices formed overlying the wafer. The substrate is a product of processes performed on the wafer. For example, as shown in FIG. 10, the substrate can include field oxide regions 12, and MOS transistors 15 18 19 having source regions, drain region and gate electrodes 18 with sidewall spacers 19. Additionally, the substrate can comprises word lines 18 and other devices formed on the wafer 10. The term "substrate surface" is meant to include the upper most exposed layers on a semiconductor wafer, such as a silicon surface, an insulating layer and metallurgy lines.

An insulating layer 14 is deposited over a substrate 10 surface. The insulating layer 14 can be composed of borophosphosilicate glass (BPSG), BPTEOS or silicon oxide. The insulating layer 14 preferably has a thickness in a range of about 1500 and 5000Å. As shown in FIG. 10, the insulating layer covers the devices 12, 15, 18 19 on the wafer 10 (i.e., covers the substrate surface).

Still referring to FIG. 1, a passivation layer 20 is formed over the insulating layer 14. The passivation layer 20 is preferably composed of oxy-nitride or silicon nitride and is more preferably composed of silicon nitride. The passivation layer 20 preferably has a thickness in a range of between about 200 and 2000Å.

A plug contact opening 24 is formed through the passivation layer 20 and the insulating layer 14 exposing the device region 16. The plug contact opening 24 (e.g., contact opening) is used to define the polysilicon plug contact to the source region 16. The contact opening has an area in a range of about 0.09 and 0.25 μm². The plug contact opening that is has a circular shape preferably has a diameter in a range of about 0.3 and 0.5 μm.

Figure 2:
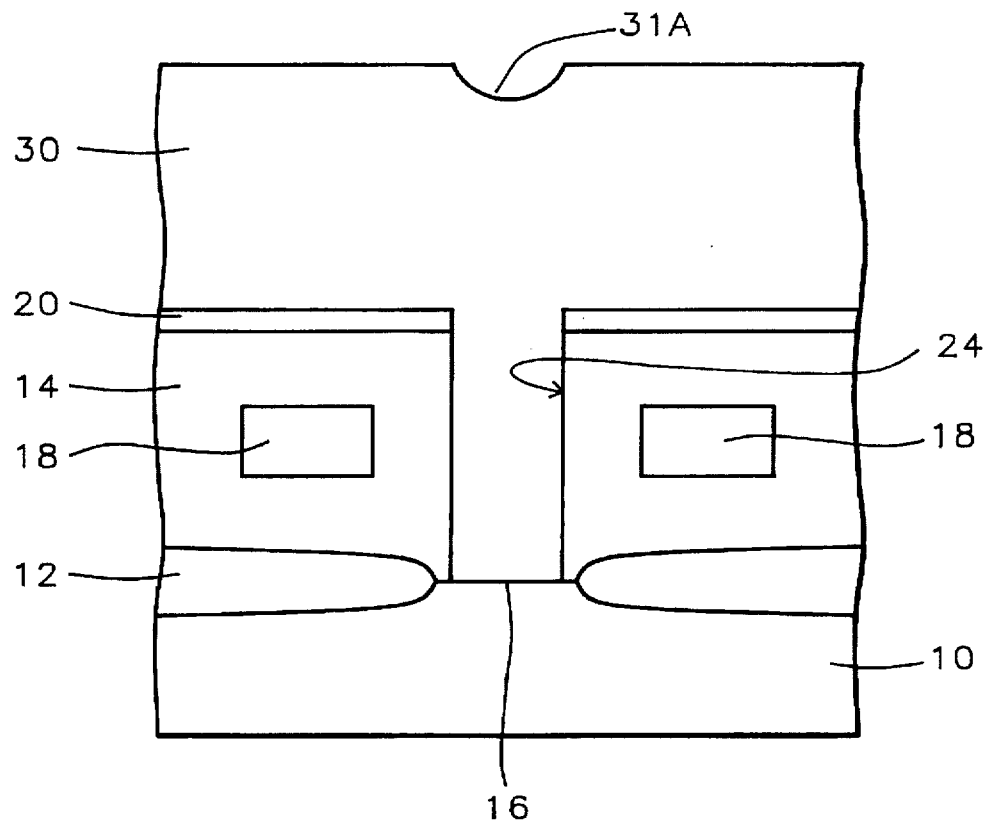

As shown in FIG. 2, a first polysilicon layer 30 is deposited over the passivation layer 20 and in the plug opening 24 (i.e., plug contact opening) to form a bottom capacitor plug 32 and making an electrical contact to the device region 16. See FIG. 3. The first polysilicon layer has a thickness in a range of between about 3000 and 6000Å. The first polysilicon layer 30 is preferably doped with an impurity with a concentration in a range of about 1E19 and 1E20 atoms/cm$^3$. The first polysilicon layer can have an indention 31a over the plug contact opening 24 as shown in FIG. 2.

Figure 3:
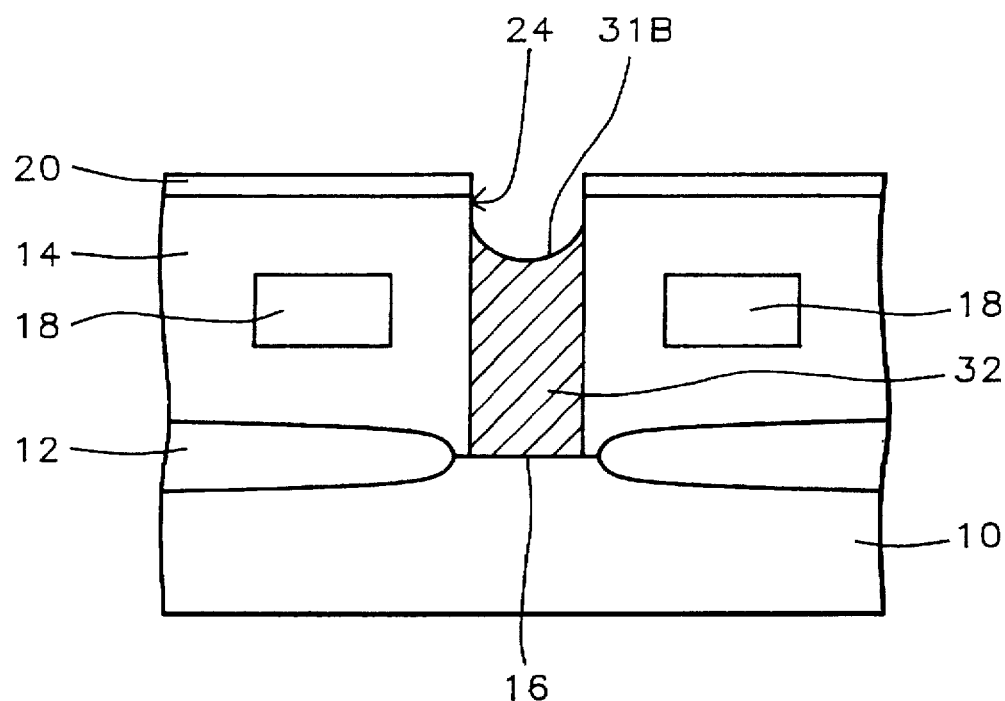

As shown in FIG. 3, the first polysilicon layer 30 is anisotropically etched or planarized so that the top surface of the first polysilicon layer 32 is level with the top surface of the passivation layer 20. The planarization can be performed using an anisotropically by reactive ion etch with a fluorine gas, such as $C_2F_6$ (carbon hexafluoride) or $CF_4+H_2$ (carbon tetrafluoride and hydrogen). The indentation is propagated down ingot the plug 32. The range that the plug 32 is etched below the passivation layer 20 from about 200 and 1200Å. The anisotropic etch propagates the indention 31a in the first polysilicon layer 30 as shown in FIG. 3.

Figure 4:
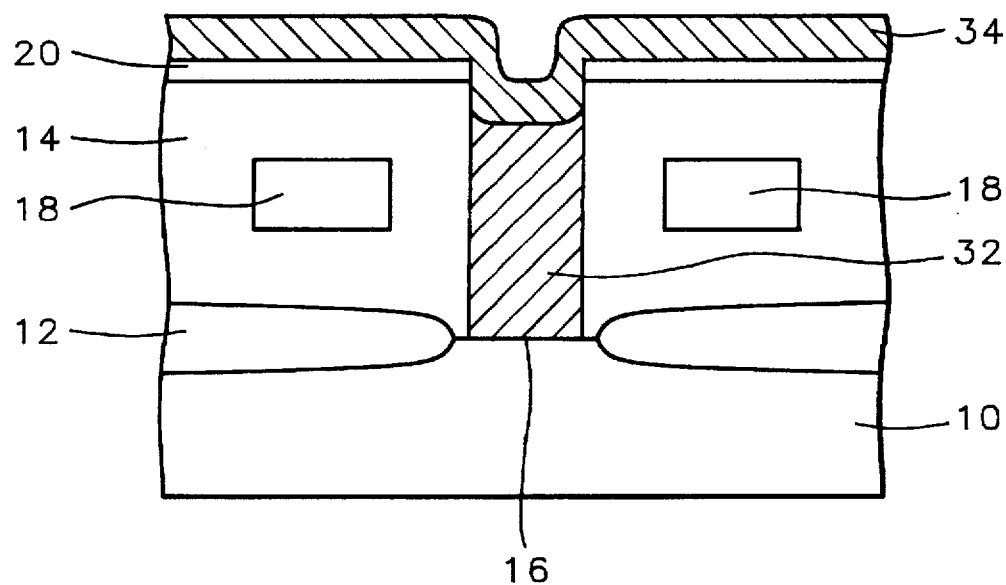

As shown in FIG. 4, a second polysilicon layer 34 is formed over the passivation layer 20 and the plug 32. The second polysilicon layer preferably has a thickness in a range of between about 500 and 2500Å and preferably has an impurity concentration in a range of about 1E19 and 1E20 atoms/cm$^3$.

Figure 5:
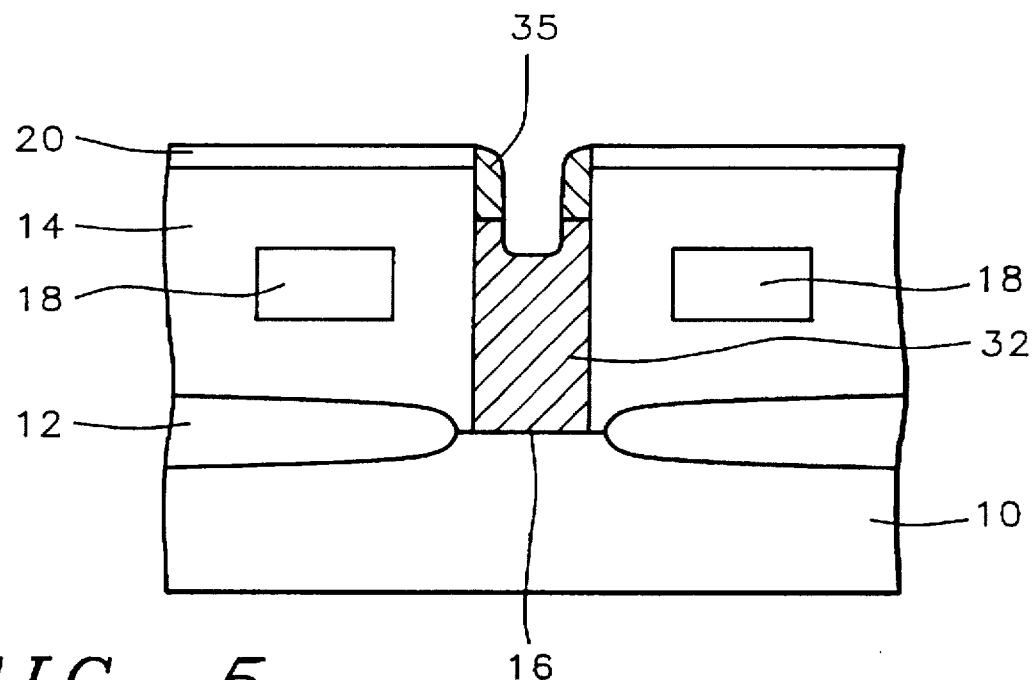

In an important step, as shown in FIG. 5, the second polysilicon layer 34 is anisotropically etched forming plug opening sidewall spacers 35 on the sidewalls of the passivation layer 20 and the insulation layer 14. The plug opening sidewall spacers 35 preferably have a width in a range of between about 400 and 2000Å. The plug spacers 35 and the plug form an etch barrier to protect the insulating layer 14 from subsequent etches as explain further below.

Figure 6:
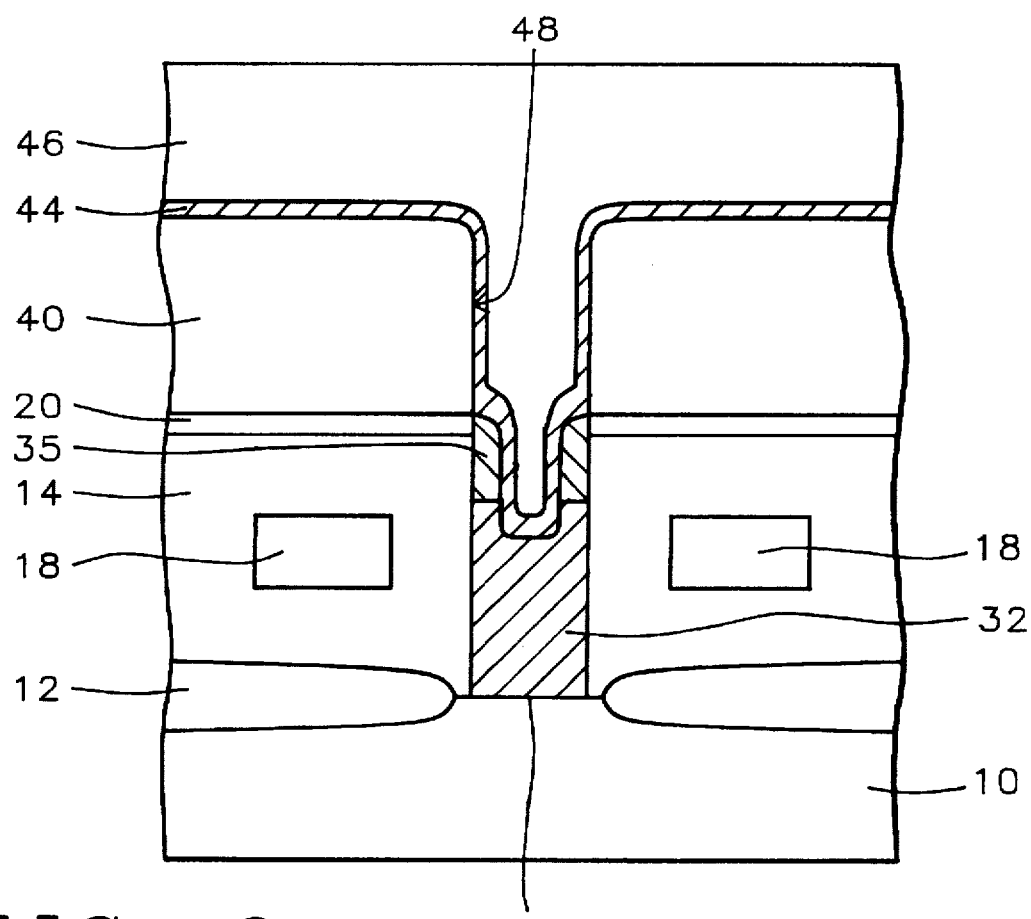

As shown in FIG. 6, a first dielectric layer 40 is formed over the substrate surface 10 including the passivation layer 20, plug spacers 35 and the bottom electrode plug 32. The first dielectric layer 40 can be composed of silicon oxide. The first dielectric layer preferably has a thickness in a range of between about 3000 and 10,000Å.

Still referring to FIG. 6, a bottom cylindrical electrode opening 48 is formed in the first dielectric layer 40 and the bottom plug 32. The bottom cylindrical electrode opening 48 at least partially exposes the plug contact opening 24 (e.g., the plug 32). The bottom electrode opening 48 is defined by sidewalls of the first dielectric layer 40. The bottom electrode opening 48 preferably has an area in a range of about 0.5 and 2.0 µm$^2$. The bottom electrode opening 48 can have any shape such as a circular or rectangular shape. The opening can also have almost any width, being limited only by the layout design and can certainly be larger and wider than illustrated in the figures. The bottom electrode opening can have an open dimension (minimum dimension, such as the short end of a rectangle) in a range of about 0.3 and 1.0 µm.

Subsequently, a third polysilicon layer 44 is formed over the first dielectric layer 40 and on the sidewalls 48 of the first dielectric layer. The third polysilicon layer contacts the bottom electrode plug 32. The third polysilicon layer 44 will be used to form a capacitor bottom electrode 50. The third polysilicon layer 44 preferably has a thickness in a range of between about 500 and 1500Å. The third polysilicon layer 44 preferably has an impurity doping concentration in a range of about 1E19 and 1E20 atoms/cm$^3$.

A second dielectric layer 46 is formed over the third polysilicon layer 44 and in the bottom electrode opening 49. The second dielectric layer 46 is preferably composed of silicon oxide. The second dielectric layer preferably has a thickness in a range of between about 10.000 and 20,000Å.

Figure 7:
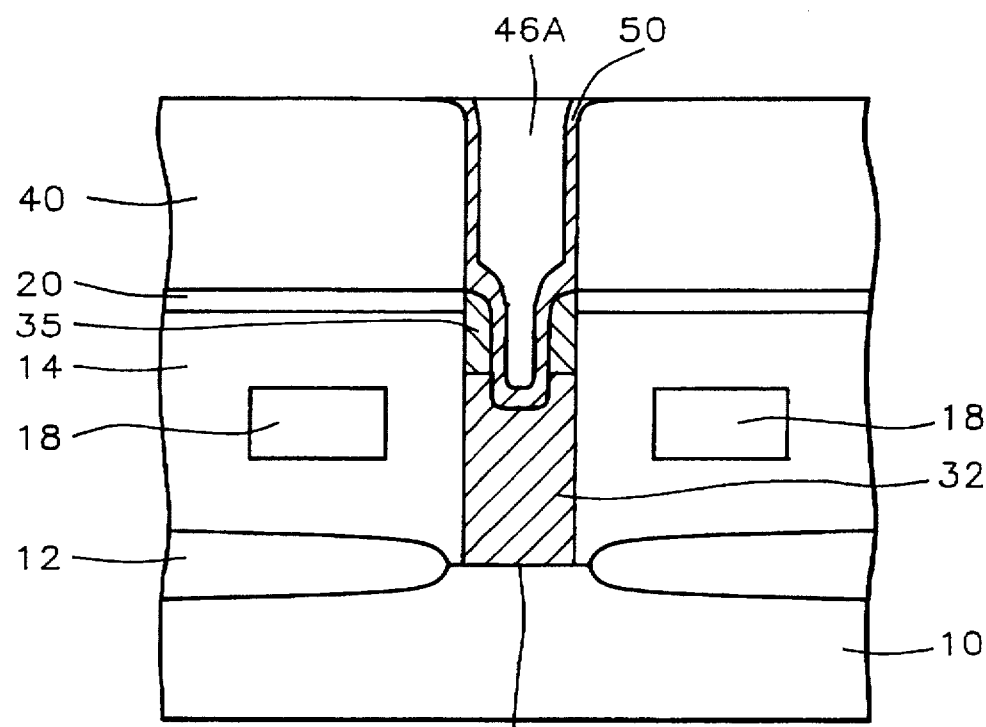

As shown in FIG. 7, the second dielectric layer 46 and the third polysilicon layer are planarized down to at least the level of the top surface of the first dielectric layer 40. The third polysilicon layer 44 over the second dielectric layer 40 is removed by the planarization. The remaining third polysilicon layer forms a capacitor bottom electrode 50 over the plug 32. The second dielectric layer 46 and the third polysilicon layer can be planarized by an anisotropic etch (e.g., a RIE etch). The planarization can be performed using an anisotropically by reactive ion etch with a fluorine gas, such as $C_2F_6$ (carbon hexafluoride) or $CF_4+H_2$ (carbon tetrafluoride and hydrogen). The second dielectric layer and the second polysilicon layer can also be removed using a chemical-mechanical polish (CMP) process, including a I or 2 step CMP process.

Figure 8:
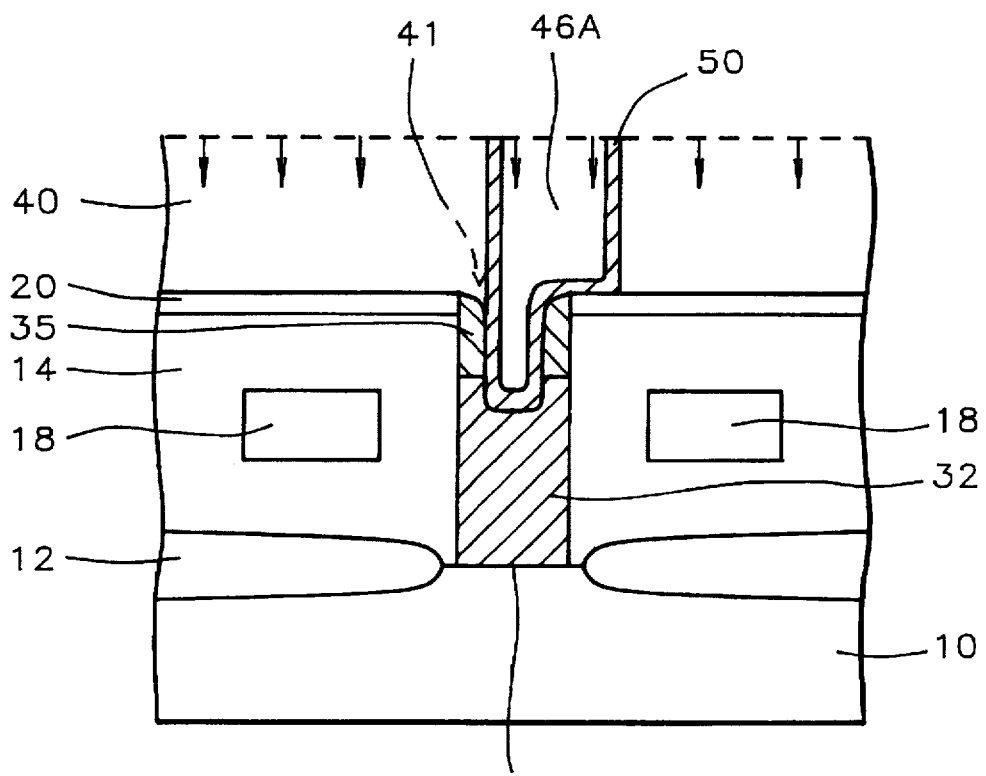

As shown in FIG. 8, the first dielectric layer 40 and the second dielectric layer 46A are removed. The first dielectric layer 40 and the second dielectric layer 46A can be removed using a conventional etch selective to the material of these layers (e.g., silicon oxide). Preferably, the first dielectric layer 40 and the second dielectric layer 46A composed of silicon oxide are removed using HF or a buffered oxide etch (BOE).

FIG. 8 shows an important feature of the invention—how the polysilicon plug spacers 35 prevent voids from being etched in the insulating layer 14 and how the photo overlay tolerances can be increased. In FIG. 8, the bottom electrode opening 48 (see FIG. 6) and thus the bottom electrode 50 is misaligned to the plug opening 24 and plug 32. The bottom electrode 50 does not cover the entire plug 32. During the etch back of the first dielectric layer 40 and the second dielectric layer 46A, the etch is blocked from etching the insulating layer 14 (and forming voids) by the spacer 35 as shown by the arrow 41 in FIG. 8.

Figure 9:
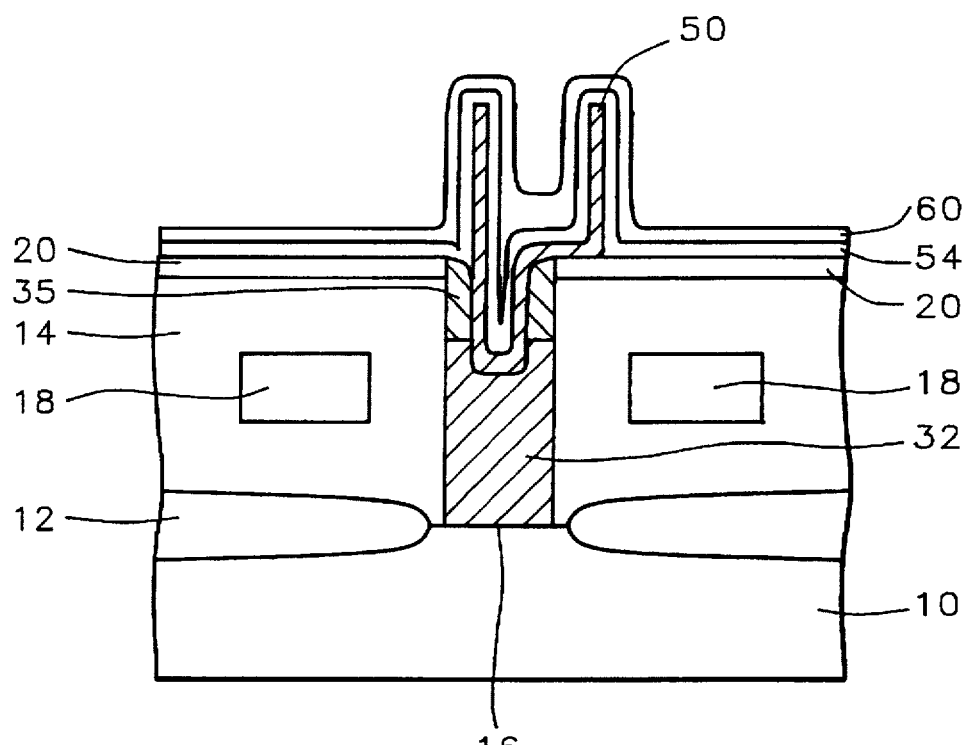

As shown in FIG. 9, a capacitor dielectric layer 54 and a fourth polysilicon layer 60 are sequentially formed over the capacitor bottom electrode 50 thereby forming a capacitor. The capacitor dielectric layer 54 can be composed on any pinhole free layer having a high dielectric constant, such as a silicon oxide layer, a nitride/oxide layer (NO) or ONO.

The fourth polysilicon layer 60 forms the top plate electrode for the capacitor. The fourth polysilicon layer 60 preferably has a thickness in a range of between about 500 and 2000Å.

As shown in FIG. 10, the invention provides a method for forming a dynamic random access memory ()AM having the improved cylindrical capacitor having the plug spacers 35. FIG. 10 shows the substrate 10 including spaced field oxide regions 12 and transistors 15 18 having source and drain regions 15 and gate electrode 18 and sidewall spacers 19. The bottom plug 32 contacts the node 15 (source) of the transistor. Also, word lines 18 19 can be formed over field oxide regions 12. More than one capacitor can be formed on a substrate and the top plate electrode 60 can connect a plurality of capacitors.

Figure 11:
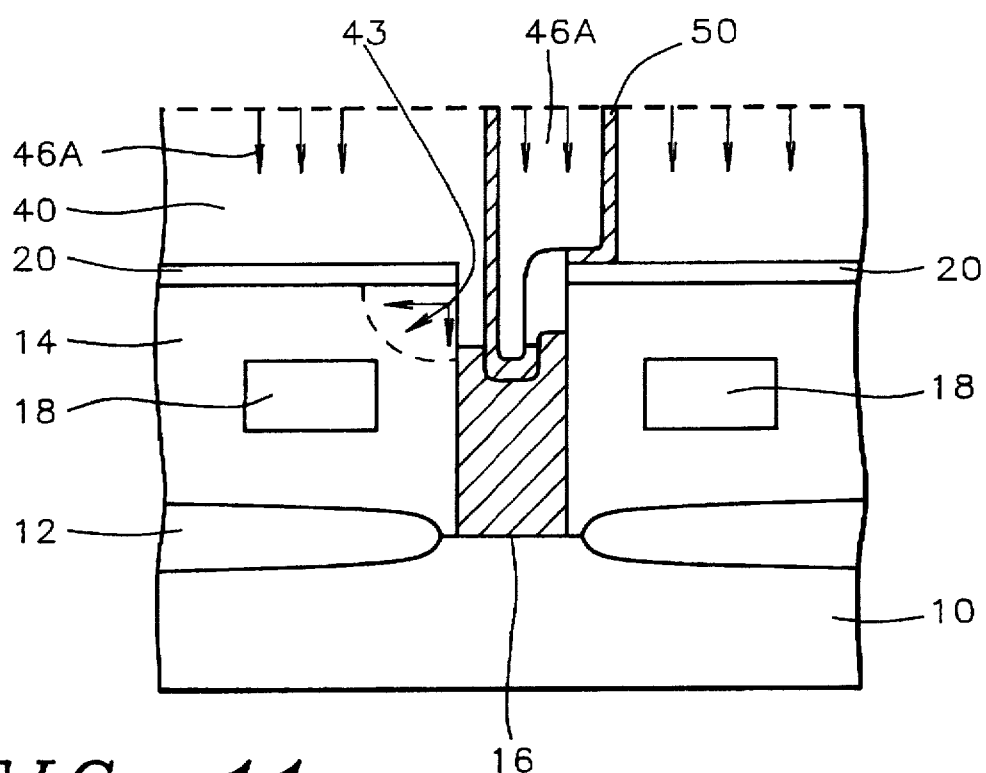
FIG. 11 is cross sectional view of a capacitor having a void problem caused by misalignment of the cylinder bottom electrode 50 and the plug 32 that is prevented by the spacers 35 of the present invention.

FIG. 11 shows the advantage of the invention in forming void free insulation layer. FIG. 11 shows the effects of misalignment in producing a void using a process without the plug spacer 35 of the present invention. As shown in FIG. 11, the top electrode 50 is misaligned relative to the plug 32 and plug opening 29. This misalignment allows the etch of first dielectric layer 40 to etch the insulation 14 as shown by the arrow 43. As shown in FIG. 11, without the spacer 35 of the present invention when the first dielectric layer 40 is etched away, a void 43 is formed in the insulating layer 14. In contrast, as shown in FIG. 9, the plug spacer 35 of the present invention and the plug 32 form an etch proof barrier around the first insulation layer 14 thus preventing the void from forming.

Figure 12:
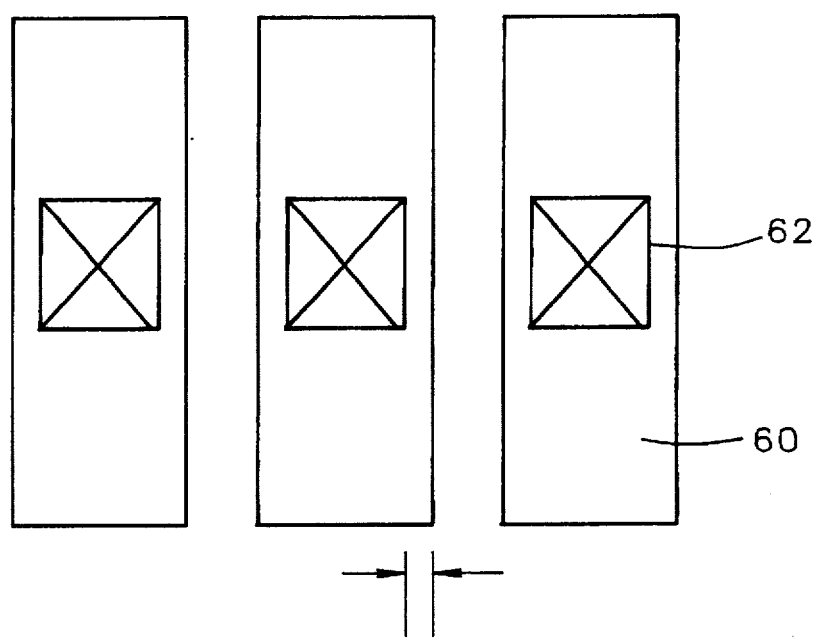
FIG. 12 is a top down view of a plug opening 24 and cylindrical electrode opening 48 photo layouts showing how the capacitor of the present invention can eliminate overlay tolerances and produce small capacitors.

FIG. 12 shows the advantage of the invention in increasing overlay tolerances. FIG. 12 shows a top down view of the plug opening patterns and bottom electrode masks. The cylindrical bottom electrode pattern 60 is shown next to the plug contact photo mask 62. The overlay 64 for the two masks/devices is shown. A conventional overlay is in a range of about 0.1 and 0.25 µm. This overlay is required to prevent the etching of voids in the insulating layer. The spacers 35 of the present invention allow the overlay to be reduced to in a range of about 0 µm. The spacers of the present invention allow the DRAM cell size to be reduced by between about 1 and 2% area.

The invention provides a method of forming a capacitor that provides a larger overlay tolerance from the bottom poly plug to the top cylindrical electrode. A key feature of the invention is the forming of the plug opening spacers 35. This spacer 35 provides the larger overlay tolerance from the bottom poly plug to the top cylindrical electrode. The spacer 35 and the polysilicon plug also prevent voids from forming in the insulating layer 14 during the wet etching of the second dielectric layer 46 due to misalignment of the bottom electrode opening 48.

While the invention has been particularly shown and described with reference to the preferred embodiments thereof it will be understood by those skilled in the art that various changes in form and details may be made without departing from the spirit and scope of the invention.

What is claimed is:

1. A method of fabricating a capacitor on a semiconductor substrate having a device region formed therein comprising the steps of:
   a) depositing an insulating layer over a substrate surface, said substrate having said device region;
   b) forming a passivation layer over said insulating layer, said passivation layer having a top surface;
   c) forming a plug opening through said passivation layer and said insulating layer exposing said device region, said plug opening defined by sidewalls of said passivation layer and of said insulation layer;
   d) depositing a first polysilicon layer over said passivation layer and in said plug opening and making an electrical contact to said device region;
   e) anisotropically etching said first polysilicon layer so that a top surface of said first polysilicon layer is below said top surface of said passivation layer to form a plug;
   f) forming plug opening sidewall spacers on the sidewalls of said passivation layer and said insulation layer, said plug opening sidewall spacers having sidewalls;
   g) forming a first dielectric layer over said passivation layer, said plug opening sidewall spacers and said plug;
   h) forming a bottom electrode opening in said first dielectric layer, said bottom electrode opening at least partially exposing said plug, said bottom electrode opening defined by sidewalls of said first dielectric layer;
   i) forming a third polysilicon layer over said first dielectric layer, said plug opening sidewall spacers and said plug;
   j) forming a second dielectric layer over said third polysilicon layer and filling said bottom electrode opening;
   k) planarizing said second dielectric layer and said third polysilicon layer down to a top surface of said first dielectric layer and removing said third polysilicon layer on the top surface of said first dielectric layer, said third polysilicon layer forming a capacitor bottom electrode over said plug;
   l) removing said first dielectric layer and said second dielectric layer using a wet etch; and
   m) forming sequentially a capacitor dielectric layer and a fourth polysilicon layer over said capacitor bottom electrode thereby forming the capacitor.

2. The method of claim 1 wherein the formation of said plug opening sidewall spacers comprises:
   forming a second polysilicon layer over said passivation layer and said plug; and
   anisotropically etching said second polysilicon layer forming the plug opening sidewall spacers on the sidewalls of said passivation layer and said insulation layer.

3. The method of claim 2 wherein said second polysilicon layer has a thickness in a range of between about 500 and 2500Å and has an impurity concentration in a range of about 1E19 and 1E20 atoms/cm$^3$.

4. The method of claim 1 wherein said plug opening sidewall spacers have a width in a range of between about 400 and 2000Å.

5. The method of claim 1 wherein said substrate further includes transistors having source regions, drain regions, and gate electrodes, one of said source regions electrically connected to said plug in said active area.

6. The method of claim 1 wherein said passivation layer has a thickness in a range of between about 200 and 2000Å and is composed of silicon nitride or oxy-nitride.

7. The method of claim 1 wherein said plug opening has a diameter in a range of between about 0.3 and 0.5 µm and said bottom electrode opening having an open dimension in a range of between about 0.3 and 1.0 µm.

8. The method of claim 1 wherein said first polysilicon layer has a thickness in a range of between about 3000 and 6000Å and is doped with an impurity with a concentration in a range of between about 1E19 and 1E20 atoms/cm$^3$.

9. The method of claim 1 wherein said insulating layer has a thickness in a range of between about 1500 and 5000Å and is composed of silicon oxide.

10. The method of claim 1 wherein said plug opening has an area in a range of between about 0.09 and 0.25 µm$^2$.

11. The method of claim 1 wherein said first dielectric layer is composed of silicon oxide, and having a thickness in a range of between about 3000 and 10,000Å.

12. The method of claim 1 wherein said bottom electrode opening has an area in a range of between about 0.5 and 2 µm$^2$.

13. The method of claim 1 wherein said third polysilicon layer has a thickness in a range of between about 500 and 1500Å.

14. The method of claim 1 wherein said second dielectric layer is composed of silicon oxide and has a thickness in a range of between about 10,000 and 20,000Å.

15. The method of claim 1 wherein said first polysilicon layer has an indentation over said contact opening.

16. A method of fabricating a capacitor on a semiconductor substrate having a device region formed therein comprising the steps of:
   a) depositing an insulating layer composed of silicon oxide over a substrate surface; said substrate having said device region;
   b) forming a passivation layer composed of silicon nitride over said insulating layer, said passivation layer having a top surface;

c) forming a plug opening through said passivation layer and said insulating layer exposing said device region;

d) depositing a first polysilicon layer over said passivation layer and in said plug opening and making an electrical contact to said device region, said first polysilicon layer having an indentation over said plug opening;

e) anisotropically etching said first polysilicon layer so that a top surface of said first polysilicon layer is below said top surface of said passivation layer to form a plug;

f) forming plug opening sidewall spacers on sidewalls of said passivation layer and said insulation layer, said plug opening sidewall spacers having sidewalls;

g) forming a first dielectric layer over said passivation layer, said plug opening sidewall spacers and said plug;

h) forming a bottom electrode opening in said first dielectric layer, said bottom electrode opening at least partially exposing said plug, said bottom electrode opening defined by sidewalls of said first dielectric layer;

i) forming a capacitor bottom electrode over said plug;

j) removing said first dielectric layer using a wet etch; and k) forming sequentially a capacitor dielectric layer and a third polysilicon layer over said capacitor bottom electrode thereby forming the capacitor.

17. The method of claim 16 wherein the formation of said capacitor bottom electrode comprises:

forming a third polysilicon layer over said first dielectric layer said plug opening sidewall spacers and said plug;

forming a second dielectric layer over said third polysilicon layer and filling said bottom electrode opening; and planarizing of said second dielectric layer and said third polysilicon layer down to a top surface of said first dielectric layer and removing said third polysilicon layer on the top surface of said first dielectric layer, said third polysilicon layer forming a capacitor bottom electrode over said plug.

18. The method of claim 16 wherein said plug opening sidewalls spacers are formed by depositing a second polysilicon layer which has a thickness in a range of between about 500 and 2500Å and has an impurity concentration in a range of between about 1E19 and 1E20 atoms/cm$^3$.

19. The method of claim 16 wherein said plug opening sidewall spacers have a width in a range of between about 400 and 2000Å.

20. The method of claim 16 wherein said substrate further includes transistors having source regions, drain regions, and gate electrodes one of said source regions electrically connected to said plug in said active area.

21. The method of claim 16 wherein said passivation layer has a thickness in a range of between about 200 and 2000Å.

22. The method of claim 16 wherein said plug opening have a diameter in a range of between about 0.3 and 0.5 μm and said bottom electrode opening having an open dimension in a range of between about 0.3 and 1.0 μm.

23. The method of claim 16 wherein said first polysilicon layer has a thickness in a range of between about 3000 and 6000Å and is doped with an impurity with a concentration in a range of between about 1E19 and 1E20 atoms/cm$^3$.

24. The method of claim 16 wherein said insulating layer has a thickness in a range of between about 1500 and 5000Å.

25. The method of claim 16 wherein said plug opening has an area in a range of between about 0.09 and 0.25 μm$^2$.

26. The method of claim 16 wherein said first dielectric layer is composed of silicon oxide, and having a thickness in a range of between about 3000 and 10,000Å.

27. The method of claim 16 wherein said bottom electrode opening has an area in a range of between about 0.5 and 2 μm$^2$.

28. The method of claim 16 wherein said third polysilicon layer has a thickness in a range of between about 500 and 1500Å.

29. The method of claim 17 wherein said second dielectric layer is composed of silicon oxide and has a thickness in a range of between about 10,000 and 20,000Å.

* * * * *